United States Patent
Huang et al.

(10) Patent No.: US 9,524,955 B2
(45) Date of Patent: Dec. 20, 2016

(54) SEMICONDUCTOR DEVICE AND METHOD OF FORMING NO-FLOW UNDERFILL MATERIAL AROUND VERTICAL INTERCONNECT STRUCTURE

(75) Inventors: Rui Huang, Singapore (SG); Heap Hoe Kuan, Singapore (SG); Yaojian Lin, Singapore (SG); Seng Guan Chow, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 6 days.

(21) Appl. No.: 13/423,782

(22) Filed: Mar. 19, 2012

(65) Prior Publication Data

US 2012/0175771 A1 Jul. 12, 2012

Related U.S. Application Data (62) Division of application No. 12/410,312, filed on Mar. 24, 2009, now Pat. No. 8,163,597.

(51) Int. Cl.
*H01L 23/02* (2006.01)
*H01L 25/10* (2006.01)
(Continued)

(52) U.S. Cl.
CPC .......... *H01L 25/105* (2013.01); *H01L 21/561* (2013.01); *H01L 21/568* (2013.01); *H01L 23/3128* (2013.01); *H01L 24/19* (2013.01); *H01L 24/96* (2013.01); *H01L 25/03* (2013.01); *H01L 25/0657* (2013.01); *H01L 24/03* (2013.01); *H01L 24/05* (2013.01); *H01L 24/11* (2013.01); *H01L 24/13* (2013.01); *H01L 24/16* (2013.01); *H01L 24/32* (2013.01); *H01L 24/81* (2013.01); *H01L 2224/0401* (2013.01); *H01L 2224/1134* (2013.01); *H01L 2224/12105* (2013.01);
(Continued)

(58) Field of Classification Search
CPC .... H01L 21/561; H01L 23/3128; H01L 24/96; H01L 25/0657; H01L 25/105; H01L 21/568; H01L 25/03; H01L 2225/1058
USPC ........ 257/685, 686, 735, 777, 778, E25.006, 257/E25.013
See application file for complete search history.

(56) References Cited

U.S. PATENT DOCUMENTS

5,250,843 A 10/1993 Eichelberger
5,353,498 A 10/1994 Fillion et al.
(Continued)

*Primary Examiner* — Hung Vu
(74) *Attorney, Agent, or Firm* — Robert D. Atkins; Patent Law Group: Atkins and Associates, P.C.

(57) ABSTRACT

A semiconductor device is made by forming a conductive layer over a first sacrificial carrier. A solder bump is formed over the conductive layer. A no-flow underfill material is deposited over the first carrier, conductive layer, and solder bump. A semiconductor die or component is compressed into the no-flow underfill material to electrically contact the conductive layer. A surface of the no-flow underfill material and first solder bump is planarized. A first interconnect structure is formed over a first surface of the no-flow underfill material. The first interconnect structure is electrically connected to the solder bump. A second sacrificial carrier is mounted over the first interconnect structure. A second interconnect structure is formed over a second side of the no-flow underfill material. The second interconnect structure is electrically connected to the first solder bump. The semiconductor devices can be stacked and electrically connected through the solder bump.

5 Claims, 8 Drawing Sheets

(51) Int. Cl.
*H01L 21/56* (2006.01)
*H01L 23/31* (2006.01)
*H01L 25/065* (2006.01)
*H01L 25/03* (2006.01)
*H01L 23/00* (2006.01)

(52) U.S. Cl.
CPC .... *H01L 2224/16* (2013.01); *H01L 2224/16225* (2013.01); *H01L 2224/32225* (2013.01); *H01L 2224/73204* (2013.01); *H01L 2224/73265* (2013.01); *H01L 2224/81203* (2013.01); *H01L 2224/81205* (2013.01); *H01L 2224/81801* (2013.01); *H01L 2224/92* (2013.01); *H01L 2224/96* (2013.01); *H01L 2225/06517* (2013.01); *H01L 2225/06541* (2013.01); *H01L 2225/06582* (2013.01); *H01L 2225/1035* (2013.01); *H01L 2225/1041* (2013.01); *H01L 2225/1058* (2013.01); *H01L 2924/0103* (2013.01); *H01L 2924/01004* (2013.01); *H01L 2924/014* (2013.01); *H01L 2924/01006* (2013.01); *H01L 2924/01013* (2013.01); *H01L 2924/01023* (2013.01); *H01L 2924/01024* (2013.01); *H01L 2924/01029* (2013.01); *H01L 2924/01046* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04941* (2013.01); *H01L 2924/04953* (2013.01); *H01L 2924/09701* (2013.01); *H01L 2924/12041* (2013.01); *H01L 2924/12042* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/30105* (2013.01)

(56) References Cited

U.S. PATENT DOCUMENTS

| | | | |
|---|---|---|---|
| 5,841,193 A | 11/1998 | Eichelberger | |
| 6,740,964 B2 * | 5/2004 | Sasaki | 257/687 |
| 6,794,761 B2 | 9/2004 | Shi et al. | |
| 6,844,052 B2 | 1/2005 | Jiang | |
| 7,034,386 B2 * | 4/2006 | Kurita | 257/685 |
| 7,335,994 B2 | 2/2008 | Klein et al. | |
| 7,619,901 B2 | 11/2009 | Eichelberger et al. | |
| 2001/0026010 A1 * | 10/2001 | Horiuchi et al. | 257/678 |
| 2004/0145051 A1 * | 7/2004 | Klein et al. | 257/734 |
| 2006/0231939 A1 | 10/2006 | Kawabata et al. | |
| 2009/0008762 A1 * | 1/2009 | Jung | 257/686 |
| 2009/0236686 A1 | 9/2009 | Shim et al. | |
| 2010/0140779 A1 * | 6/2010 | Lin | H01L 23/49816 257/690 |

* cited by examiner

SEMICONDUCTOR DEVICE AND METHOD OF FORMING NO-FLOW UNDERFILL MATERIAL AROUND VERTICAL INTERCONNECT STRUCTURE

CLAIM TO DOMESTIC PRIORITY

The present application is a division of U.S. patent application Ser. No. 12/410,312, now U.S. Pat. No. 8,163,597, filed Mar. 24, 2009, and claims priority to the foregoing application.

FIELD OF THE INVENTION

The present invention relates in general to semiconductor devices and, more particularly, to a semiconductor device and method of forming no-flow underfill material around a vertical interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between a fan-out wafer level chip scale package (FO-WLCSP) containing semiconductor devices on multiple levels (3-D device integration) and external devices can be accomplished with conductive through silicon vias (TSV), through hole vias (THV), or Cu-plated conductive pillars. Vias are formed in silicon or organic material around the die using laser drilling or deep reactive ion etching (DRIE). The vias are filled with conductive material, for example by copper deposition through an electroplating process, to form the conductive TSVs and THVs. A wafer level molding compound is deposited in the final manufacturing stages after the vertical interconnect structure is formed. The dimension of temporary carrier/wafer chunk table must be customized to fit wafer level molding system. The formation of TSV and THV, as well as wafer level molding, involves special equipment, slow processes, and costly manufacturing steps.

SUMMARY OF THE INVENTION

A need exists to form a vertical interconnect structure in a semiconductor package. Accordingly, in one embodiment, the present invention is a semiconductor device comprising a first semiconductor die and vertical interconnect structure disposed outside the first semiconductor die. A conductive layer electrically connects the first semiconductor die to the vertical interconnect structure. An insulating material is disposed around the first semiconductor die and vertical interconnect structure with the insulating material, first semiconductor die, and vertical interconnect structure having a planar surface. A first interconnect structure is formed over the planar surface. A second interconnect structure is formed over the conductive layer and insulating material opposite the first interconnect structure.

In another embodiment, the present invention is a semiconductor device comprising a first semiconductor die and vertical interconnect structure. A conductive layer electrically connects the first semiconductor die to the vertical interconnect structure. An insulating material is disposed around the first semiconductor die and vertical interconnect structure with the insulating material, first semiconductor die, and vertical interconnect structure having a planar surface. A first interconnect structure is formed over the planar surface.

In another embodiment, the present invention is a semiconductor device comprising a vertical interconnect structure and insulating material disposed around the vertical interconnect structure. A first semiconductor die is disposed into the insulating material such that the insulating material, first semiconductor die, and vertical interconnect structure have a planar surface. A first interconnect structure is formed over the planar surface.

In another embodiment, the present invention is a semiconductor device comprising a first semiconductor die and vertical interconnect structure. An insulating material is disposed around the first semiconductor die and vertical interconnect structure with the insulating material, first semiconductor die, and vertical interconnect structure having a planar surface.

BRIEF DESCRIPTION OF THE DRAWINGS

FIGS. 3a-3l illustrate a process of forming no-flow underfill material around vertical interconnect structure;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
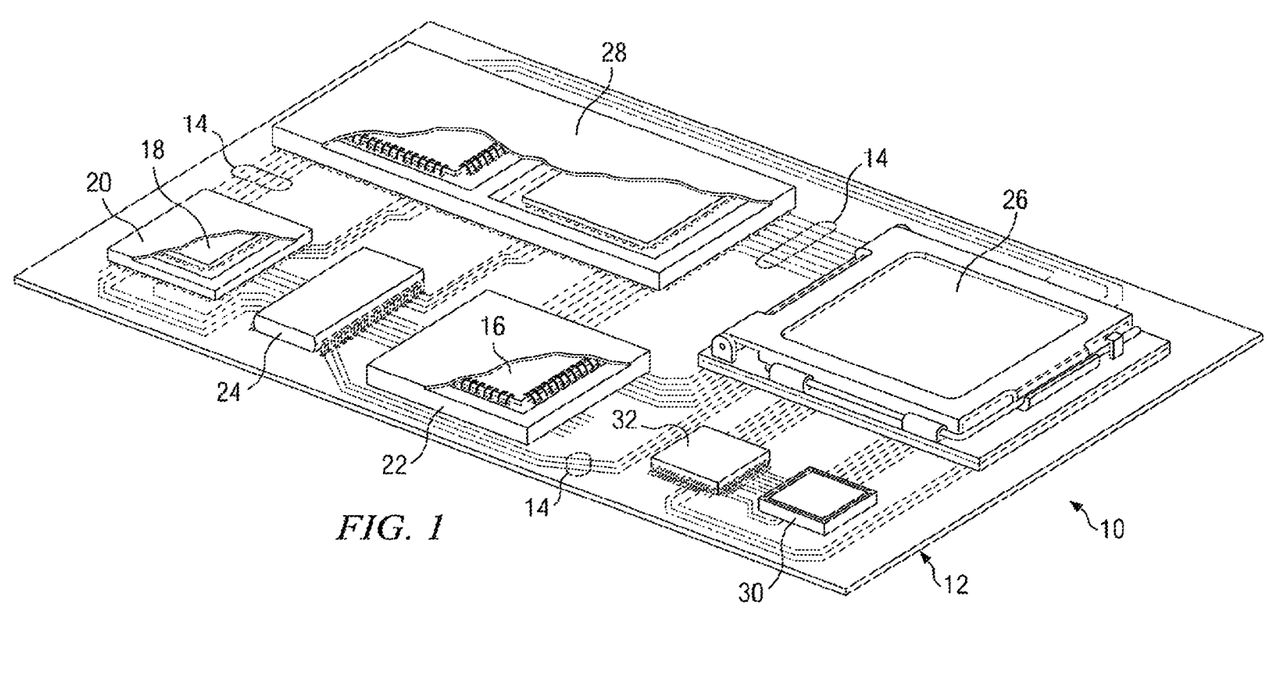
FIG. 1 illustrates a printed circuit board (PCB) with different types of packages mounted to its surface.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
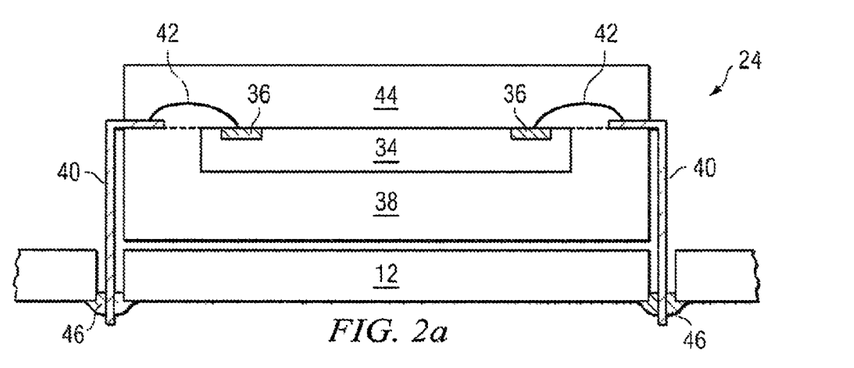
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
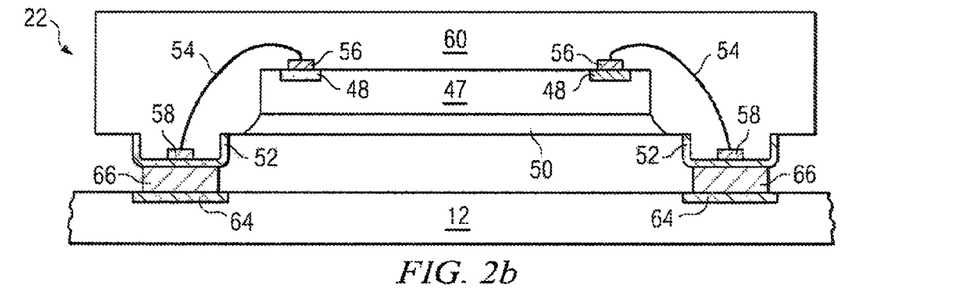

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
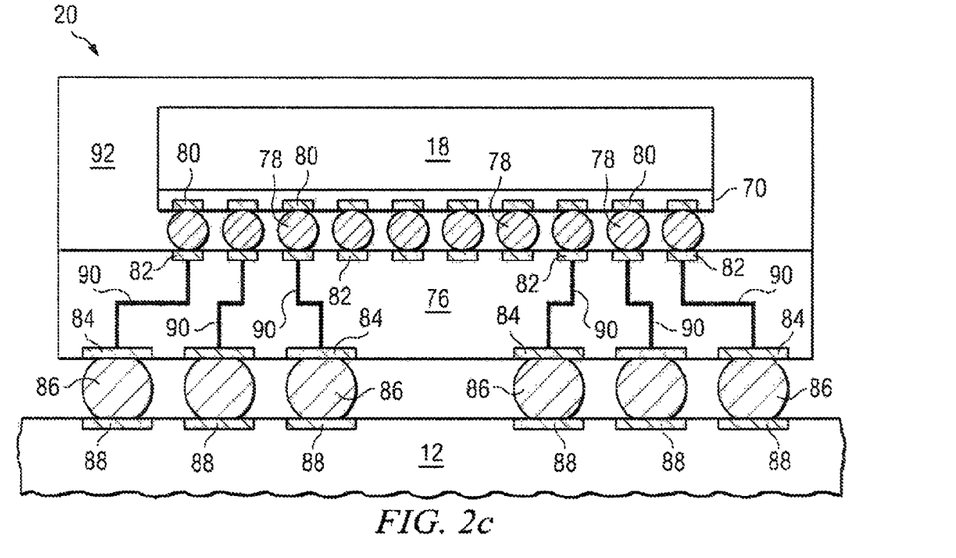

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3A:
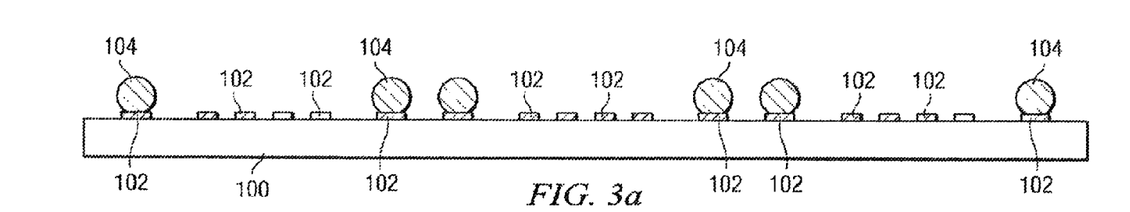

FIGS. 3a-3l illustrate a process of forming a vertical (z-direction) interconnect structure for a fan-out wafer level chip scale package (FO-WLCSP). In FIG. 3a, a sacrificial wafer-form substrate or carrier 100 contains dummy or sacrificial base material such as silicon, polymer, polymer composite, metal, ceramic, glass, glass epoxy, beryllium oxide, or other suitable low-cost, rigid material or bulk semiconductor material for structural support. In one embodiment carrier 100 is 20.3 centimeters (cm) in diameter. An optional interface layer can be formed over carrier 100 as a temporary bonding film or etch-stop layer.

A conductive layer 102 is formed in individual portions or sections over a top surface of carrier 100 using a deposition and patterning process. Conductive layer 102 is formed using PVD, CVD, sputtering, electrolytic plating, electroless plating process, or other suitable metal deposition process. Conductive layer 102 can be one or more layers of Al, Cu, Sn, Ni, Au, Ag, or other suitable electrically conductive material. The individual portions of conductive layer 102 can be electrically common or electrically isolated depending on the design and function of the semiconductor die. Some portions of conductive layer 102 operate as an under bump metallization layer (UBM) or bump pad for later-formed solder bumps. UBM 102 can be a multi-metal stack with adhesion layer, barrier layer, and seed or wetting layer. The adhesion layer is formed over carrier 100 or interface layer and can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer for the subsequent solder bumps or other interconnect structure. In one embodiment, UBM 102 contains multiple layers of selectively plated Ni/Au, Ti/Cu, TiW/Cu, Ti/Cu/NiV/Cu, or their combination. UBM 102 provides a low resistive interconnect, as well as a barrier to solder diffusion and seed layer for solder wettability.

An electrically conductive solder material is deposited over conductive layer 102 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 104. In some applications, solder bumps 104 are reflowed a second time to improve electrical contact to conductive layer 102. Solder bumps 104 represent one type of vertical, z-direction interconnect structure that can be formed over conductive layer 102. Multiple rows of solder bumps 104 increase the z-direction interconnect capacity. The interconnect structure can also use bond wires, conductive pillars, stud bump, micro bump, or other electrical interconnect.

Figure 3B:
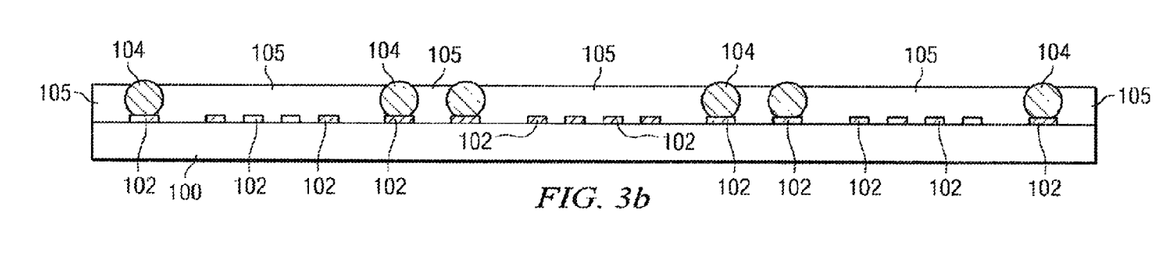

FIG. 3b shows a no-flow underfill material (NFM) 105 deposited over carrier 100, conductive layer 102, and around solder bumps 104 using spin coating, dispensing, or lamination. NFM 105 can be an epoxy resin having a high coefficient of thermal expansion (CTE) and high glass transition temperature. U.S. Pat. Nos. 6,180,696 and 6,794,761 describe other suitable no-flow underfill material and are incorporated herein by reference. The volume deposition of NFM 105 is controlled to a thickness that covers a major portion of solder bumps 104 and exposes the remainder of the solder bumps.

Figure 3C:
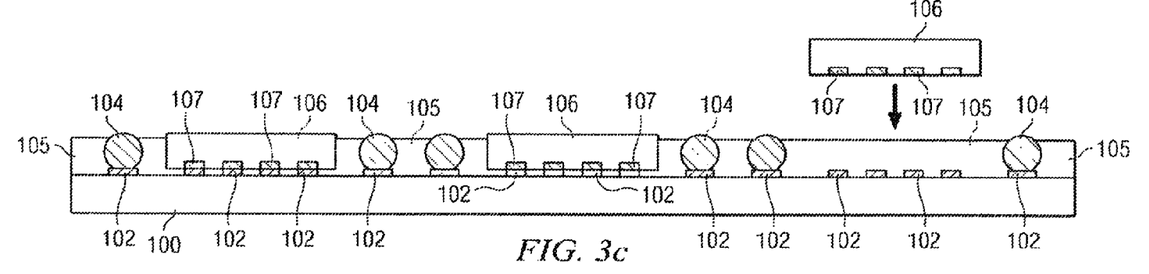

In FIG. 3c, semiconductor die 106 are mounted over carrier 100 with contact pads 107 electrically contacting conductive layer 102 using solder, micro bumps, or other electrical interconnect. Semiconductor die 106 are compressed under force into NFM 105, e.g., using thermal compression bonding or ultrasonic bonding, to form a compression bond to carrier 100. Solder micro bumps are reflowed to electrically connect contact pads 107 to conductive layer 102, while simultaneously fluxing and polymerization of no flow underfill material 105. Semiconductor die 106 each include a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or baseband digital circuits, such as digital signal processor (DSP), memory, or other signal processing circuit. Semiconductor die 106 may also contain integrated passive devices (IPD), such as inductors, capacitors, and resistors, for radio frequency (RF) signal processing. In another embodiment, a discrete component can be mounted over carrier 100 and electrically connected to conductive layer 102. Semiconductor die 106 can be flipchip-type die or other semiconductor die without bumps.

Figure 3D:
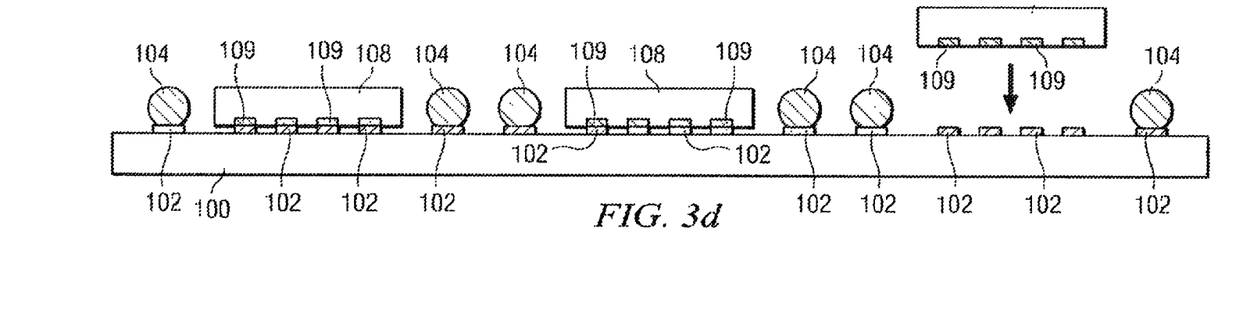

In an alternate embodiment to the structure shown in FIGS. 3b and 3c, semiconductor die 108 are mounted over carrier 100 with contact pads 109 electrically contacting conductive layer 102 using solder, micro bumps, or other electrical interconnect, as shown in FIG. 3d. Semiconductor die 108 each include a substrate with an active region containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within its active surface to implement analog circuits or baseband digital circuits, such as DSP, memory, or other signal processing circuit. Semiconductor die 108 may also contain IPD, such as inductors, capacitors, and resistors, for RF signal processing.

Figure 3E:
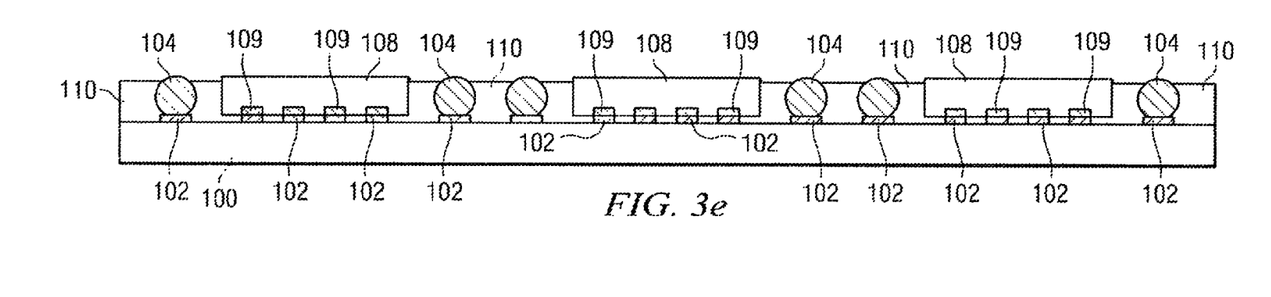

FIG. 3e shows an encapsulant or molding compound 110 deposited over carrier 100, conductive layer 102, and around solder bumps 104 using a paste printing, compressive molding, transfer molding, liquid encapsulant molding, vacuum lamination, or other suitable applicator. Encapsulant 110 can be polymer composite material, such as epoxy resin with filler, epoxy acrylate with filler, or polymer with proper filler, having similar properties as NFM 105. The volume deposition of encapsulant 110 is controlled to a thickness that exposes a top portion of solder bumps 104. Alternatively, a portion of encapsulant 110 is removed by an etching process to expose solder bumps 104. Encapsulant 110 is non-conductive and environmentally protects the semiconductor device from external elements and contaminants.

Figure 3F:
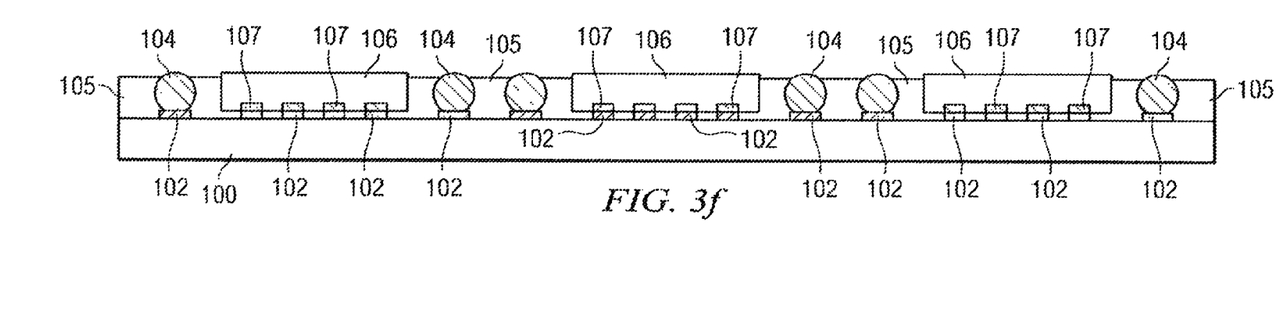

After the process described in FIGS. 3b-3c or the process described in FIGS. 3d-3e, NFM 105 (or encapsulant 110) is cured and hardened in FIG. 3f. Semiconductor die 106 (or semiconductor die 108) and solder bumps 104 extend above NFM 105 (or encapsulant 110), as shown in FIG. 3f. NFM 105 (or encapsulant 110) eliminates the need for wafer level molding as found in the prior art. The remainder of the description relates to FIGS. 3b-3c, although the process and structure shown in FIGS. 3d-3e are understood.

Figure 3G:
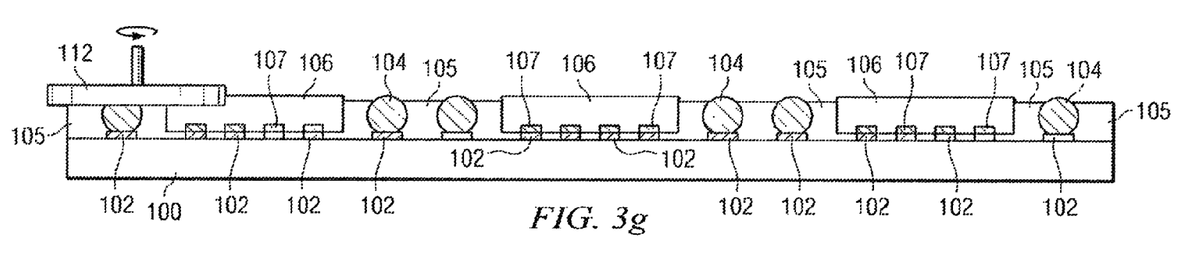

In FIG. 3g, a grinder 112 removes a portion of NFM 105, solder bumps 104, and a back surface of semiconductor die 106 to create a planar surface. Alternatively, the portion of NFM 105, solder bumps 104, and back surface of semiconductor die 106 can be removed by chemical etching, mechanical peel-off, or CMP.

Figure 3H:
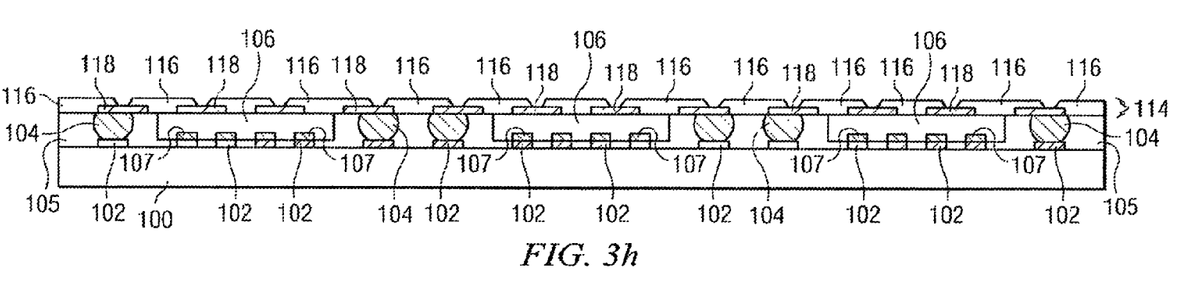

In FIG. 3h, a topside build-up interconnect structure 114 is formed over NFM 105, solder bumps 104, and semiconductor die 106. The build-up interconnect structure 114 includes an insulating or passivation layer 116 containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layers 116 are formed using PVD, CVD, printing, spin coating, spray coating, sintering or thermal oxidation.

The topside build-up interconnect structure 114 further includes an electrically conductive layer 118 formed in insulating layer 116 using a patterning and deposition process. Conductive layer 118 is formed using PVD, CVD, sputtering, electrolytic plating, electroless plating process, or other suitable metal deposition process. Conductive layer 118 can be one or more layers of Al, Cu, Sn, Ni, Au, Ag, or other suitable electrically conductive material. A portion of insulating layer 116 is removed by an etching process to expose conductive layer 118. One portion of conductive layer 118 electrically connects to solder bumps 104. Other portions of conductive layer 118 can be electrically common or electrically isolated depending on the design and function of the semiconductor device.

Figure 3I:
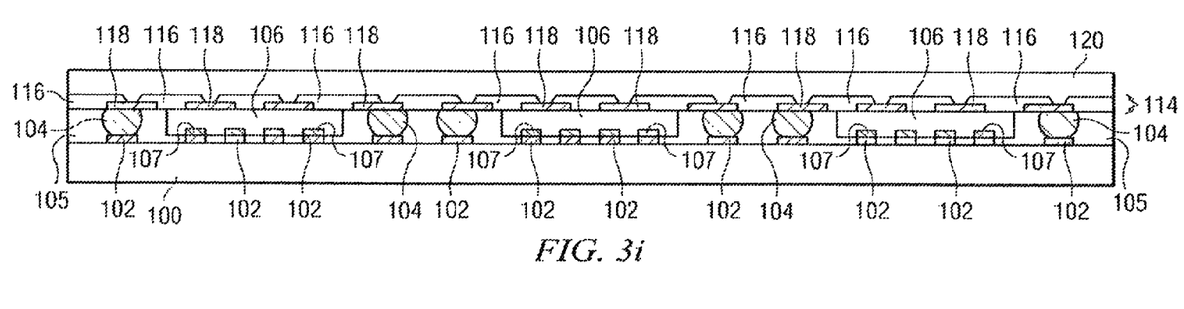

In FIG. 3i, a sacrificial wafer-form substrate or carrier 120 is formed over build-up interconnect structure 114. Carrier 120 contains dummy or sacrificial base material such as silicon, polymer, polymer composite, metal, ceramic, glass, glass epoxy, beryllium oxide, or other suitable low-cost, rigid material or bulk semiconductor material for structural support. An optional interface layer can be formed between carrier 120 and build-up interconnect structure 114 as a temporary bonding film or etch-stop layer.

Figure 3J:
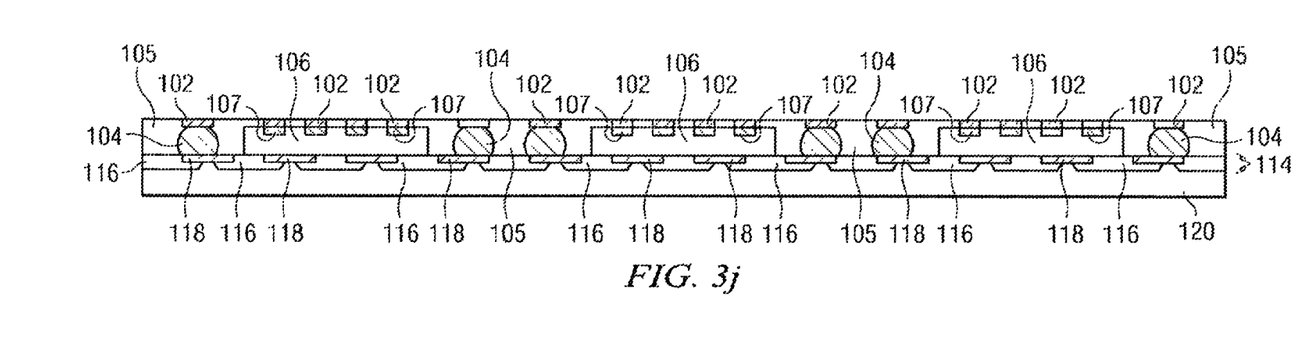
Figure 3K:
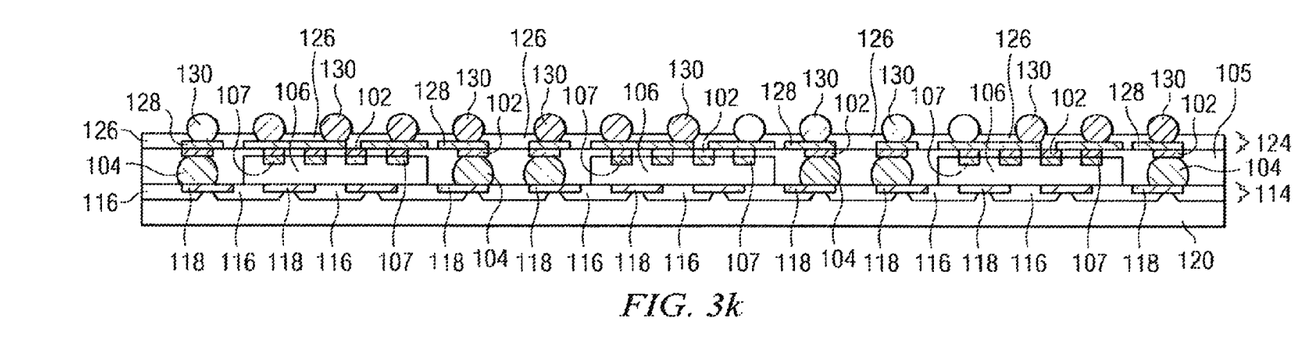

In FIG. 3j, carrier 100 and optional interface layer are removed by chemical etching, mechanical peel-off, CMP, mechanical grinding, thermal bake, laser scanning, or wet stripping. The assembly is inverted and a bottom-side build-up interconnect structure 124 is formed over NFM 105 and conductive layer 102, as shown in FIG. 3k. The build-up interconnect structure 124 includes an insulating or passivation layer 126 containing one or more layers of SiO2, Si3N4, SiON, Ta2O5, Al2O3, or other material having similar insulating and structural properties. The insulating layers 126 are formed using PVD, CVD, printing, spin coating, spray coating, sintering or thermal oxidation.

The bottom-side build-up interconnect structure 124 further includes an electrically conductive layer 128 formed in insulating layers 126 using a patterning and deposition process. Conductive layer 128 is formed using PVD, CVD, sputtering, electrolytic plating, electroless plating process, or other suitable metal deposition process. Conductive layer 128 can be one or more layers of Al, Cu, Sn, Ni, Au, Ag, or other suitable electrically conductive material. A portion of insulating layer 126 is removed by an etching process to expose conductive layer 128. One portion of conductive layer 128 electrically connects to solder bumps 104, conductive layer 102, and contact pads 107 of semiconductor die 106. Other portions of conductive layer 128 can be electrically common or electrically isolated depending on the design and function of the semiconductor device.

The conductive layers and insulating layers in build-up interconnect structures 114 and 124 can form one or more IPDs. For example, an insulating layer between two conductive layers can be a metal-insulator-metal (MIM) capacitor. Other conductive layers can be wound or coiled in plan-view to produce or exhibit properties of an inductor. A resistive layer can also be formed within build-up interconnect structures 114 and 124 from TaxSiy or other metal silicides, TaN, NiCr, TiN, or doped poly-silicon.

The IPDs provide electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

An electrically conductive solder material is deposited over conductive layer 128 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 130. In some applications, solder bumps 130 are reflowed a second time to improve electrical contact to conductive layer 128. Solder bumps 130 represent one type of interconnect structure that can be formed over conductive layer 128. The interconnect structure can also use bond wires, 3-D interconnects, conductive paste, stud bump, micro bump, or other electrical interconnect.

Semiconductor die 106 are singulated with saw blade or laser cutting device 132 into individual semiconductor devices 134, as shown in FIG. 3*l*.

Figure 4:
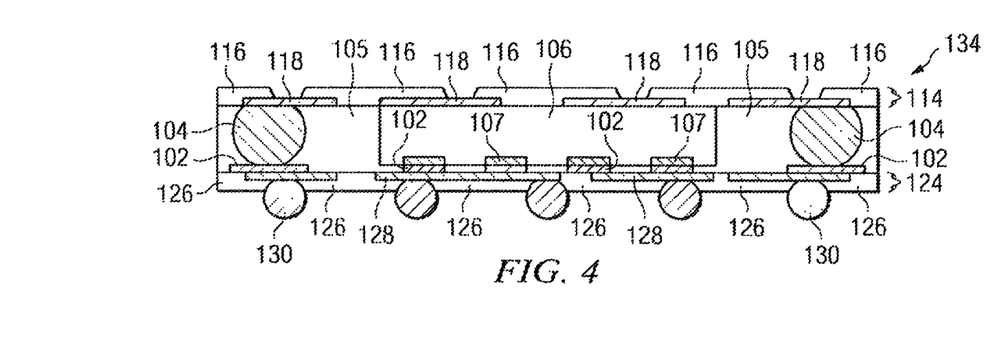
FIG. 4 illustrates the FO-WLCSP with no-flow underfill material around vertical interconnect structure.

FIG. 4 shows semiconductor package 134 after singulation. Solder bumps 104 provide z-direction interconnect between topside interconnect build-up layer 114 and bottom-side interconnect build-up layer 124. The z-direction interconnect is formed in no-flow underfill material to simplify the manufacturing process and reduce costs. Conductive layer 118 electrically connects through solder bumps 104 to conductive layers 102 and 128 and contact pads 107 of semiconductor die 106.

Figure 5:
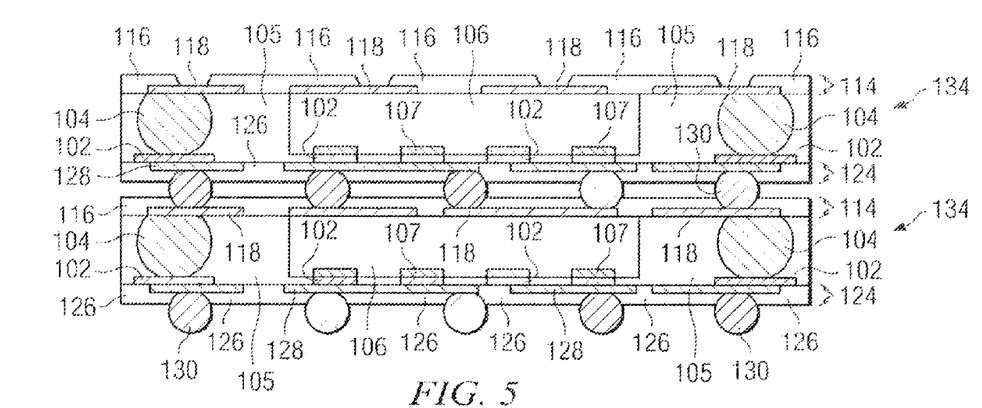
FIG. 5 illustrates stacked FO-WLCSPs electrically connected through the vertical interconnect structure.

FIG. 5 shows stacked semiconductor packages 134. Solder bumps 104 provide z-direction interconnect between topside interconnect build-up layer 114 and bottom-side interconnect build-up layer 124. Conductive layer 118 electrically connects through solder bumps 104 to conductive layers 102 and 128 and contact pads 107 of semiconductor die 106 of each semiconductor package 134.

Figure 6:
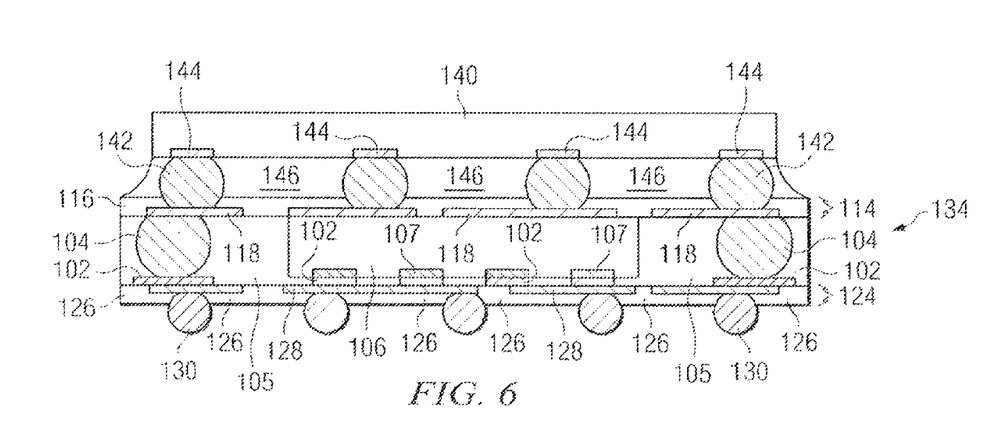
FIG. 6 illustrates a semiconductor die mounted to the FO-WLCSP and electrically connected through the vertical interconnect structure.

In FIG. 6, a semiconductor die 140 is mounted to build-up interconnect structure 114. Solder bumps 142 electrically connect contact pads 144 of semiconductor die 140 to conductive layer 118. An underfill material 146, such as an epoxy resin having proper rheological and insulating properties, is deposited beneath semiconductor die 140 for stress relief and preventing contamination. Solder bumps 104 and build-up interconnect structures 114 and 124 provide z-direction interconnect between semiconductor die 140 and semiconductor die 106. The electrical components within semiconductor die 140 are routed through contact pads 144, solder bumps 142 and 104, build-up interconnect structures 114 and 124, and contact pads 107 to the electrical components of semiconductor die 106.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a first conductive layer;
a vertical interconnect structure disposed over the first conductive layer;
a no-flow insulating material disposed around the vertical interconnect structure and the first conductive layer;
a first semiconductor die embedded within the no-flow insulating material over the first conductive layer, wherein the no-flow insulating material, first semiconductor die, and vertical interconnect structure includes a planar surface and the first conductive layer is partially embedded in the no-flow insulating material to cover a side surface of the first conductive layer;
a first interconnect structure formed over the planar surface, the first interconnect structure including a second conductive layer formed in direct contact with the vertical interconnect structure and a surface of the no-flow insulating material and extending over the surface of the no-flow insulating material outside a contact interface between the first interconnect structure and the vertical interconnect structure;
a second semiconductor die disposed over the first interconnect structure and directly overlying the first semiconductor die, wherein the second semiconductor die is a duplicate of the first semiconductor die; and
a second interconnect structure formed over and contacting the first conductive layer opposite the first interconnect structure.

2. The semiconductor device of claim 1, wherein the first interconnect structure or second interconnect structure includes an integrated passive device.

3. The semiconductor device of claim 1, further including a plurality of stacked semiconductor devices.

4. The semiconductor device of claim 1, wherein the vertical interconnect structure includes a bump.

5. The semiconductor device of claim 1, wherein the first interconnect structure or second interconnect structure includes an insulating layer.

* * * * *